(12) United States Patent
Basin et al.

(10) Patent No.: US 11,024,781 B2
(45) Date of Patent: Jun. 1, 2021

(54) GLUELESS LIGHT EMITTING DEVICE WITH PHOSPHOR CONVERTER

(71) Applicant: Lumileds LLC, San Jose, CA (US)

(72) Inventors: Grigoriy Basin, San Francisco, CA (US); Paul Martin, Livermore, CA (US); Han Ho Choi, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 15/102,986

(22) PCT Filed: Dec. 30, 2014

(86) PCT No.: PCT/IB2014/067412
§ 371 (c)(1),
(2) Date: Jun. 9, 2016

(87) PCT Pub. No.: WO2015/104623
PCT Pub. Date: Jul. 16, 2015

(65) Prior Publication Data
US 2017/0301832 A1    Oct. 19, 2017

Related U.S. Application Data

(60) Provisional application No. 61/924,283, filed on Jan. 7, 2014.

(51) Int. Cl.
*H01L 33/00* (2010.01)
*H01L 33/50* (2010.01)
(Continued)

(52) U.S. Cl.
CPC ........ *H01L 33/505* (2013.01); *H01L 33/0095* (2013.01); *H01L 33/60* (2013.01);
(Continued)

(58) Field of Classification Search
CPC ............. H01L 33/00; H01L 33/50–508; H01L 33/504; H01L 33/505; H01L 33/507;
(Continued)

(56) References Cited

U.S. PATENT DOCUMENTS 7,344,952 B2 * 3/2008 Chandra ............... H01L 33/505
257/E21.352
7,560,294 B2   7/2009 Suehiro et al.
(Continued)

FOREIGN PATENT DOCUMENTS

CN    102800794 A    11/2012
CN    103165797 A    6/2013
(Continued)

OTHER PUBLICATIONS

EPC Article 94(3), dated Jan. 19, 2017, EP Application No. 14837008.3, LUM Reference No. 2013P00918WE, 6 pages.
(Continued)

*Primary Examiner* — Natalia A Gondarenko

(57) ABSTRACT

A multi-stage lamination process is used to laminate a wavelength conversion film to a transparent substrate, and subsequently to a light emitting element. The wavelength conversion film may be an uncured phosphor-embedded silicone polymer, and the lamination process includes heating the polymer so that it adheres to the transparent substrate, but is not fully cured. The phosphor-laminated transparent substrate is sliced/diced and the wavelength conversion film of each diced substrate is placed upon each light emitting element. The semi-cured wavelength conversion film is then laminated to the light emitting element via heating, consequently curing the phosphor film. Throughout the process, no glue is used, and the optical losses associated with glue material are not introduced.

15 Claims, 3 Drawing Sheets

(51) Int. Cl.
*H01L 33/60* (2010.01)
*H01L 33/58* (2010.01)

(52) U.S. Cl.
CPC ...... *H01L 33/58* (2013.01); *H01L 2933/0041* (2013.01); *H01L 2933/0058* (2013.01)

(58) Field of Classification Search
CPC ............. H01L 33/60; H01L 33/48–648; H01L 2933/0058; H01L 2933/0066–0091; H01L 2924/00; H01L 2924/00014; H01L 2924/01322; H01L 23/28; H01L 21/56; H01L 21/568; H01L 24/97; H01L 25/0753; H01L 2224/48091; H01L 2224/45144; H01L 2224/16225; H01L 2224/73265; H01L 33/501; H01L 33/508; H01L 33/44; H01L 33/46; H01L 33/52; H01L 33/54; H01L 33/56; H01L 33/58; H01L 33/62; H01L 33/0095; H01L 2933/0033; H01L 2933/005; H01L 2933/0041; H01L 2924/01101–01103; H01L 2924/01105–01107; H01L 2924/12041; H01L 2293/0033; H01L 21/461; H01L 21/463; H01L 21/449; H01L 21/565; H01L 2021/60195; H01L 2021/30187; H01L 2021/60187; H01L 2021/6018; H01L 2021/603; C09K 11/7792; C09K 11/7718; C09K 11/7774; C09K 11/7721; C09K 11/7769; F21K 9/56; C08J 5/18; C08L 83/04; C30B 1/10; C30B 29/22
USPC ............. 257/13, 79–103, E33.061, E33.072; 438/27, 29
See application file for complete search history.

(56) References Cited

U.S. PATENT DOCUMENTS

| | | | |
|---|---|---|---|
| 7,858,408 B2* | 12/2010 | Mueller | H01L 33/54 438/27 |
| 8,937,329 B2 | 1/2015 | Katayama | |
| 8,946,983 B2 | 2/2015 | Matsumura et al. | |
| 2005/0269582 A1* | 12/2005 | Mueller | C04B 35/44 257/94 |
| 2005/0274967 A1* | 12/2005 | Martin | C03C 3/12 257/98 |
| 2008/0048200 A1* | 2/2008 | Mueller | B29C 41/14 257/98 |
| 2008/0121911 A1* | 5/2008 | Andrews | H01L 33/58 257/98 |
| 2008/0308828 A1 | 12/2008 | Kashiwagi et al. | |
| 2008/0315228 A1* | 12/2008 | Krames | H01L 33/46 257/98 |
| 2009/0014744 A1 | 1/2009 | Hsieh et al. | |
| 2010/0019260 A1* | 1/2010 | Epler | H01L 33/16 257/98 |
| 2010/0320479 A1* | 12/2010 | Minato | H01L 33/505 257/88 |
| 2011/0001148 A1* | 1/2011 | Sun | H01L 33/60 257/88 |
| 2011/0012149 A1* | 1/2011 | Basin | H01L 33/60 257/98 |
| 2011/0049545 A1* | 3/2011 | Basin | H01L 24/97 257/98 |
| 2011/0073878 A1* | 3/2011 | Li | F21V 29/70 257/88 |
| 2012/0025218 A1 | 2/2012 | Ito et al. | |
| 2012/0261688 A1* | 10/2012 | Raukas | H01L 33/505 257/98 |
| 2013/0001605 A1* | 1/2013 | Ishihara | H01L 33/505 257/88 |
| 2013/0033169 A1 | 2/2013 | Ito et al. | |
| 2013/0149508 A1* | 6/2013 | Kwak | H01L 33/505 428/201 |
| 2013/0207151 A1* | 8/2013 | Eberhardt | H01L 33/505 257/98 |
| 2014/0124809 A1* | 5/2014 | Kashiwagi | B32B 3/16 257/98 |
| 2014/0131752 A1* | 5/2014 | Kondo | H01L 22/24 257/98 |
| 2014/0175488 A1* | 6/2014 | Kashiwagi | H01L 33/501 257/98 |

FOREIGN PATENT DOCUMENTS

| | | |
|---|---|---|
| CN | 103236485 A | 8/2013 |
| CN | 103311404 A | 9/2013 |
| EP | 2610314 A1 | 7/2013 |
| JP | 2000-022222 A | 1/2000 |
| JP | 2006-041479 A | 2/2006 |
| JP | 2012-033823 A | 2/2012 |
| JP | 2013-001791 A | 1/2013 |
| WO | 2009069671 A1 | 6/2009 |

OTHER PUBLICATIONS

EPO as ISA, International Search Report and Written Opinion dated Apr. 21, 2015 from International Application No. PCT/IB2014/067412, filed Dec. 30, 2014, 12 pages.

* cited by examiner

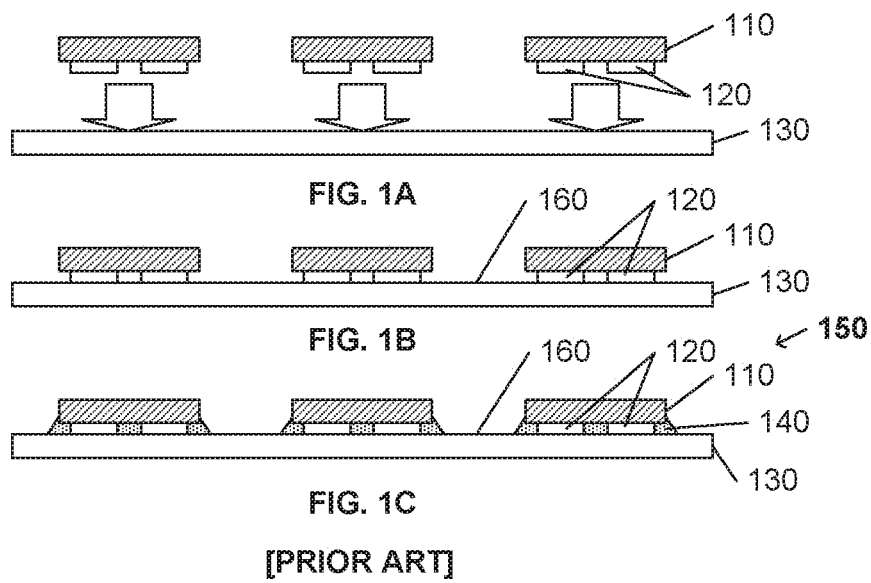
FIG. 1A
FIG. 1B
FIG. 1C
[PRIOR ART]
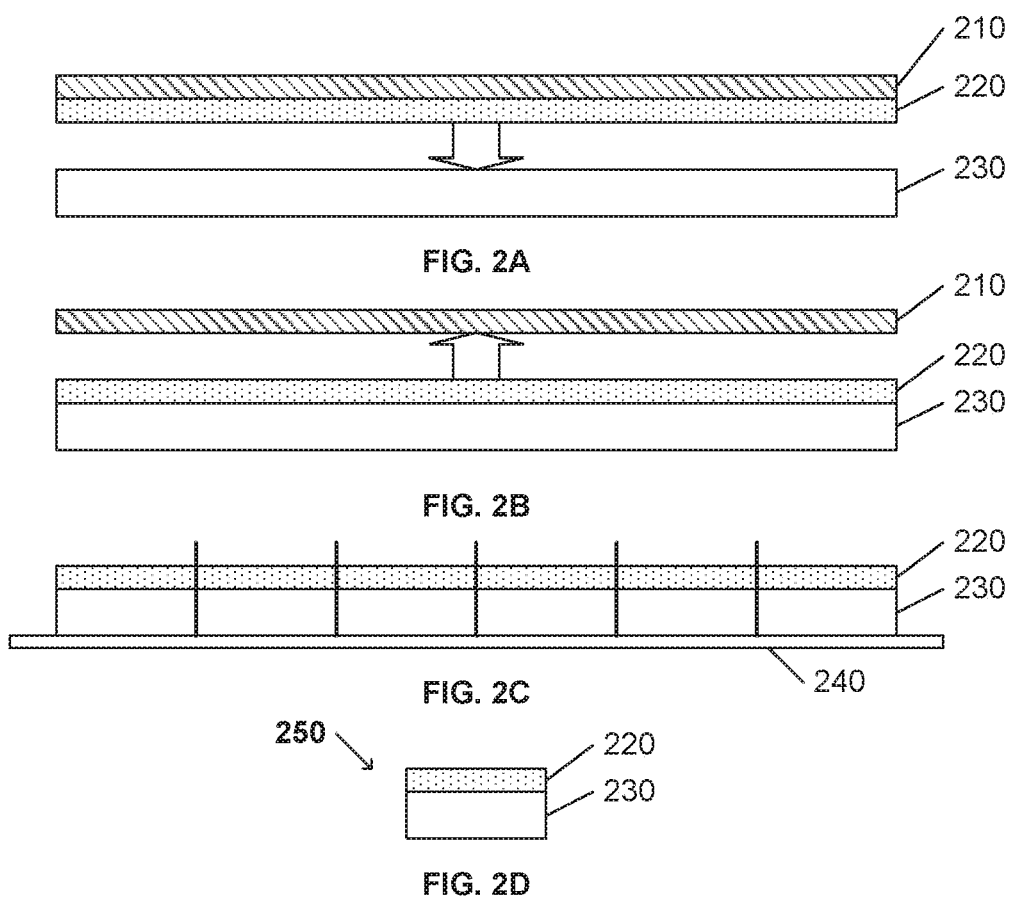
FIG. 2A
FIG. 2B
FIG. 2C
FIG. 2D

GLUELESS LIGHT EMITTING DEVICE WITH PHOSPHOR CONVERTER

CROSS-REFERENCE TO RELATED APPLICATIONS

The present application is a § 371 application of International Application No. PCT/I132014/067412 filed on Dec. 30, 2014 and entitled "GLUELESS LIGHT EMITTING DEVICE WITH PHOSPHOR CONVERTER," which claims priority to U.S. Provisional Application No. 61/924,283, filed Jan. 7, 2014. International Application No. PCT/I132014/067412 and U.S. Provisional Application No. 61/924,283 are incorporated herein.

FIELD OF THE INVENTION

This invention relates to the field of light emitting devices, and in particular to light emitting devices that include a phosphor converter and does not use glue to adhere the elements together.

BACKGROUND OF THE INVENTION

The ever expanding use of semiconductor light emitting devices has produced a highly competitive market for these devices. In this market, performance and price are often significant for providing product distinction among vendors. Decreasing optical losses, and consequently increasing light output efficiency, provides improved performance, as does improving optical quality. If the process used to decrease the optical losses and/or improve the optical quality can be performed with lesser manufacturing costs, the performance to price ratio may increase dramatically.

Conventional light emitting devices typically include a number of discrete elements that are used to produce light of a desired color with a desired light output pattern. In most embodiments, a light emitting element emits light at a particular wavelength; a wavelength conversion element, typically a phosphor material, converts some or all of the emitted light into one or more other wavelengths so that the composite light output is of the desired color and color temperature; and an optical element directs the composite light output to produce the desired light output pattern. For ease of reference, the term phosphor is used herein as a synonym for a wavelength conversion material, although any material that emits light at a different wavelength than the wavelength of the light emitted by the light emitting element may be included in this definition.

In some embodiments, the optical element includes the wavelength conversion material, and is molded over the light emitting element in a shape that provides the desired light output pattern. In such embodiments, however, it is difficult to maintain a consistent composite color output, as the particular concentration of phosphors within the optical element varies from batch to batch, and the particular wavelength of light emitting by the light emitting element varies from wafer to wafer.

In other embodiments, preformed wavelength conversion films are produced and the wavelength conversion characteristics of each film are determined via testing. In like manner, the wavelength characteristics of the light emitting elements of each wafer are determined via testing. To achieve a desired composite color output, the film selected for application to the light emitting elements of a wafer is selected such that the characteristics of the film in combination with the characteristics of the light emitting elements of the particular wafer result in the desired composite color output. The light emitting elements are situated on a substrate with appropriate spacing between the elements; the film is overlaid upon the light emitting elements on the substrate, and then laminated to the light emitting elements and the substrate in the space between the light emitting elements using a combination of vacuum and heat to conform and adhere the film to the light emitting elements and the substrate. Optical elements are formed over the light emitting elements with laminated phosphor film.

The use of preformed and pre-characterized wavelength conversion films provide for a consistent composite color output among light emitting devices produced by the matching of the characteristics of each film with the characteristics of each set of light emitting elements, but is a more costly process than the molding of a phosphor embedded material over the light emitting elements.

In another embodiment, preformed wavelength conversion plates are created, typically by embedding one or more phosphors in glass. These plates may be tested and characterized, as in the above preformed film embodiments, and matched to particular sets of light emitting elements to provide the desired composite color output. The wavelength conversion plate is sliced/diced to form platelets that are substantially the same size as the light emitting surface of the light emitting elements, then glued to each of the light emitting elements. Optical elements are formed over the light emitting elements with attached phosphor platelets.

The use of pre-characterized wavelength conversion platelets provides consistent color light output, as in the use of pre-characterized wavelength conversion films, but may provide a lower product cost because the relatively costly wavelength conversion material is only applied over the light emitting surface, and not over the spaces between the light emitting elements. The introduction of glue between the platelet and the light emitting element, however, increases the manufacturing complexity and the glue material introduces optical losses. Additionally, glue materials generally have poor thermal conductance properties, and serve to inhibit the dissipation of the heat generated by the light emitting device to the surrounding environment.

SUMMARY OF THE INVENTION

It would be advantageous to provide a method for producing light emitting devices with wavelength conversion material that exhibit consistent composite color output with minimal optical losses. It would also be advantageous if the method did not introduce additional manufacturing complexities and/or costs. It would be further advantageous if the method provided a reduction in manufacturing complexity and/or cost.

To better address one or more of these concerns, in an embodiment of this invention, a multi-stage lamination process is used to laminate a wavelength conversion film to a transparent substrate, and subsequently to a light emitting element. The wavelength conversion film may be an uncured phosphor-embedded silicone polymer, and the lamination process includes heating the polymer so that it adheres to the glass substrate, but is not fully cured. The phosphor-laminated glass substrate is sliced/diced and the phosphor film of each diced substrate is placed upon each light emitting element. The semi-cured phosphor film is then laminated to the light emitting element via heating, consequently curing the phosphor film. Throughout the process, no glue is used, and the optical losses associated with glue material are not introduced.

BRIEF DESCRIPTION OF THE DRAWINGS

The invention is explained in further detail, and by way of example, with reference to the accompanying drawings wherein:

FIGS. 1A-1C illustrate an example production of light emitting elements on a substrate.

FIGS. 2A-2D illustrate an example lamination of a wavelength conversion film upon a transparent substrate, and the slicing/dicing of the substrate to provide diced platelets with wavelength conversion laminates.

Throughout the drawings, the same reference numerals indicate similar or corresponding features or functions. The drawings are included for illustrative purposes and are not intended to limit the scope of the invention.

DETAILED DESCRIPTION

Figure 3A:
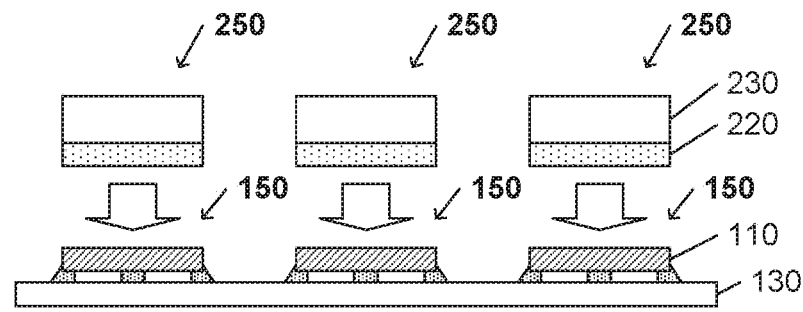
FIGS. 3A-3D illustrate an example lamination of diced platelets with wavelength conversion laminates to light emitting elements on a substrate, and the molding of reflective material around each laminate structure on the substrate.

In the following description, for purposes of explanation rather than limitation, specific details are set forth such as the particular architecture, interfaces, techniques, etc., in order to provide a thorough understanding of the concepts of the invention. However, it will be apparent to those skilled in the art that the present invention may be practiced in other embodiments, which depart from these specific details. In like manner, the text of this description is directed to the example embodiments as illustrated in the Figures, and is not intended to limit the claimed invention beyond the limits expressly included in the claims. For purposes of simplicity and clarity, detailed descriptions of well-known devices, circuits, and methods are omitted so as not to obscure the description of the present invention with unnecessary detail.

FIGS. 1A-1C illustrate an example production of light emitting elements 110 on a substrate 130. The light emitting elements 110 may be any of a variety of conventional light emitting elements and may include, for example, an active light emitting layer sandwiched between an N-type and P-type semiconductor layers. Contact pads 120 enable external power connections to the light emitting element 110. Although the light emitting element 110 have both contacts on one side in "flip-chip" configuration, and other suitable configuration of contact such as one contact on each side is included within the scope of the invention.

The light emitting elements 110 may be placed upon the substrate 130 using conventional pick-and-place processes, with appropriate space 160 between the light emitting elements, as illustrated in FIGS. 1A-1B. The substrate 130 may be a surface upon which the light emitting elements 110 are temporarily adhered; but in many embodiments, the substrate 130 forms a permanent support for the light emitting elements 110 and includes conductors (not shown) to which the contact pads 120 are coupled, typically via solder. The conductors may extend through the substrate 130 to allow external contact to the light emitting elements 110 from the lower surface of the substrate.

To provide mechanical support to the light emitting elements 110 on the substrate 130, a filler material 140 may be applied beneath the light emitting elements 110. This filler material 140 may be reflective to redirect light toward the upper surface of the light emitting element 110, the intended light emitting surface.

For ease of reference, the light emitting structure upon the substrate 130 is referred to hereinafter as structure 150. One of skill in the art will recognize that the light emitting structure 150 may include different elements than the one detailed above.

As noted above, a wavelength conversion material may be added to the light emitting structures 150 using any of a variety of techniques. An optical element with embedded phosphor may be molded over the structures 150; a preformed phosphor-embedded film may be laminated to the substrate 130, covering each structure 150 and the space 160 between these structures; or, a phosphor-embedded platelet may be glued to the light emitting surface of the structures 150.

In an embodiment of this invention, a preformed and pre-characterized phosphor embedded film is laminated to a transparent plate, and this plate is sliced/diced into platelets that are the same size as the light emitting surface of the light emitting structure 150. Of particular note, the phosphor embedded film is a polymer that is in a semi-cured (class B) state and the lamination process is such that the polymer is not fully cured after it is laminated to the glass plate. In a subsequent lamination process, the phosphor embedded film on the platelet is laminated to the light emitting surface of the light emitting structure 150, and in this process, the polymer is fully cured.

FIGS. 2A-2D illustrate an example lamination of a wavelength conversion film upon a transparent substrate, and the slicing/dicing of the transparent substrate to provide diced platelets with laminated wavelength conversion elements.

In FIG. 2A, a preformed wavelength conversion film 220 on a supporting release layer 210 is placed upon a transparent substrate 230. The wavelength conversion film 220 may be produced using the processes described in U.S. Pat. No. 7,344,952 issued to Haryanto Chandra on 18 Mar. 2008, and incorporated by reference herein:

"Thin phosphor sheets may be formed by depositing a silicone-phosphor mixture on a non-stick release layer overlying a flat surface and then spinning the material to form a thin sheet of uniform thickness. A thin sheet may also be formed by depositing a predetermined amount of the silicone-phosphor mixture in a mold, or by spraying a predetermined amount of material on a release layer . . . .

"In one embodiment, the phosphor sheet is partially cured by applying heat so that the sheet is flexible and somewhat tacky. The sheet is then removed from the flat surface along with the release layer." (U.S. Pat. No. 7,344,952, col. 3, line 66-col. 4, line 24.)

The wavelength conversion film 220 may be tested to determine its wavelength conversion characteristics. In such an embodiment, light emitting elements having different light output characteristics, such as different particular wavelengths of emitted light, are "binned" based on these characteristics, as also disclosed in U.S. Pat. No. 7,344,952. For example, if the light emitting elements emit blue light with a nominal wavelength of 450 nm, the tested light emitting elements may be grouped in one of four bins 1-4 as follows: 1) 440-445 nm; 2) 445-450 nm; 3) 450-455 nm; and 4) 455-460 nm. Based on the tested characteristics of the wavelength conversion film, the appropriate bin is identified for matching with the wavelength conversion film to achieve a desired composite color output. The desired composite color output may be, for example, white light at a desired color temperature. The light emitting elements 110 of the light emitting structures 150 are each obtained from the identified bin for pairing with the particular wavelength conversion film 220. Alternatively, multiple wavelength conversion films having different characteristics may be provided, and the particular wavelength conversion film 220 may be selected to correspond to the characteristics of the particular light emitting elements 110 of the light emitting structures 150 to produce the desired composite color output.

The transparent substrate 230 may be any transparent material, including glass, sapphire, plastic, and so on, glass and sapphire generally being preferred over plastic for better thermal dissipation. For ease of reference, the terms "glass" and "plate" are used hereinafter as a synonym for a substrate that is transparent to the light emitted by the light emitting element 110 and any light emitted by wavelength conversion film 220.

After the wavelength conversion film 220 is situated on the transparent substrate 230, the film 220 is laminated to the substrate 230 by applying heat, pressure, and vacuum. The applied heat is controlled to limit the curing of the wavelength conversion film 220, and may be in the range of 70-100° C. for an example polymer having a curing temperature of 140-160° C. The visco-elastic behavior of the polymer (G'—storage modulus and TanDelta—ratio between loss and storage modulus) defines the heat that needs to be applied to the film. The supporting release sheet 210 may be removed, as illustrated in FIG. 2B, after the lamination of the wavelength conversion film 220 to the transparent substrate 230. Optionally, the release sheet 210 may remain on the wavelength conversion film 220 until after the slicing/dicing process (below), but this would require removing the release material from each of the diced platelets.

The transparent substrate 230 with laminated wavelength conversion film 220 may be placed on a slicing surface 240, and sliced/diced, as illustrated in FIG. 2C, to produce individual 'platelets' 250 comprising the corresponding pieces of wavelength conversion film 220 laminated to transparent substrate ('plate') 230. Each of these platelets 250 may be shaped to be substantially the same size as the light emitting surface of the light emitting structures 150. Nominally, the substrate may be about 50-200 microns thick, and the wavelength conversion film may be between 50 and 150 microns thick.

FIGS. 3A-3D illustrate an example lamination of diced platelets 250 with wavelength conversion laminates to light emitting structures 150 on a substrate, and the molding of reflective material around each laminate structure on the substrate.

Figure 3B:
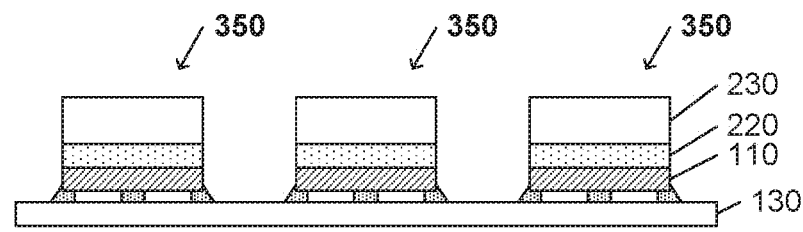

In FIGS. 3A-3B, the individual platelets 250 with laminate wavelength conversion material 220 are placed upon the light emitting structures 150, using, for example, a conventional pick-and-place machine with heating stage, common in the art of semiconductor manufacture. The temperature of the heating stage is around 120-150 C, thus allowing the wavelength conversion material to adhere to light emitting structure 150. The final cure can take 1-4 hours depending on the type of polymer in lamination film.

Figure 3C:
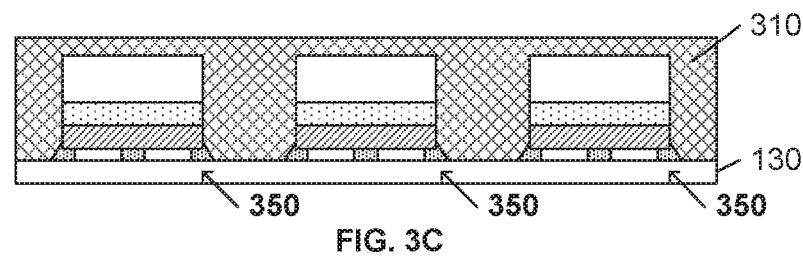

In FIG. 3C, a material 310 may be applied to reflect the converted light, protect the light emitting element 110 and wavelength conversion material 220 from environmental effects, and/or to provide structural support to the resultant device.

Figure 3D:
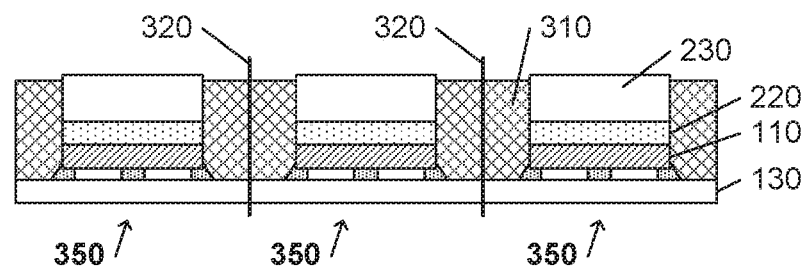

In FIG. 3D, the encasing material 310 is finished to expose the light emitting surface 235 of the transparent substrate element 230. Microbead blasting or other planning techniques may be used to effect this surface finishing of the encasing material 310. The surface finishing may also roughen the surface of the substrate element 230, providing an increase in light output efficiency through that surface by reducing total internal reflections (TIR) at the surface.

The encasing material may be reflective of the light emitted by the light emitting element 110 and any light emitted by wavelength conversion film 220. This material is arranged to reflect light that would otherwise escape through the sides of the platelet 250 and structure 150 so that it may eventually escape via the light emitting surface 235 of the transparent substrate 230. A mixture of silicone and TiO2, with a concentration of 20% TiO2 or more provides for a highly reflective encasing material 310, although other materials may be used.

After exposing the light emitting surface of the substrate element 230, the substrate 130 and the encasing material 310 may be sliced/diced, as illustrated by cutting lines 320 in FIG. 3D, to provide individual light emitting devices 350.

The resultant light emitting devices 350 can be expected to exhibit consistent light output characteristics among devices 350 due to the use of a preformed and pre-characterized wavelength conversion film 220 that is match to the characteristics of the light emitting elements 110 on the substrate 130. The devices 350 can also be expected to exhibit high light output efficiency due to the absence of glue layers and due to the presence of reflective materials 310 and 140. The devices 350 can also be expected to exhibit good thermal dissipation due, again, to the absence of glue layers and due to the use of a transparent substrate 230 with high thermal conductivity, such as glass.

Figure 4:
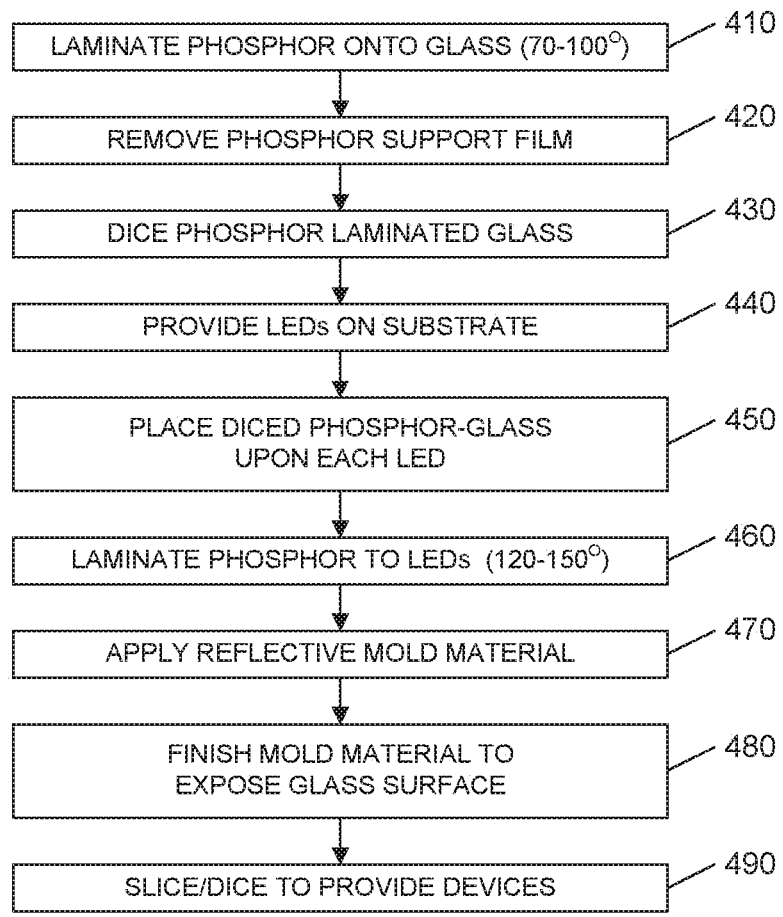
FIG. 4 illustrates an example flow diagram for a multi-stage lamination of a wavelength conversion film to a transparent substrate and to a light emitting element, and subsequent molding of reflective material around each laminate structure.

FIG. 4 illustrates an example flow diagram for a multi-stage lamination of a wavelength conversion film to a transparent substrate and to a light emitting element, and subsequent molding of reflective material around each laminate structure. For ease of description and understanding, the process is presented using the example of a transparent substrate of glass, and a wavelength conversion film comprising phosphor, such as phosphor embedded in a silicone polymer.

At 410, the phosphor film is laminated onto the glass substrate. The lamination may be effected by heating the glass to 70-100° C., which will leave the phosphor film in a semi-cured state.

If the phosphor film had been situated on a supporting release sheet, that sheet may be removed, at 420. Note, however, that the supporting sheet may also be removed before the heat is applied to laminate the phosphor film to the glass.

At 430, the phosphor laminated glass is sliced/diced to provide individual phosphor-glass platelets that are sized to cover the light emitting surface area of the light emitting elements that are provided on a substrate, at 440.

As noted above, the light emitting elements that are provided on the substrate may be selected to have light emitting characteristics that are matched to the characteristics of the phosphor film to provide a desired composite color output; or, the particular phosphor film may be selected to match the characteristics of the light emitting elements to provide the desired composite color output.

At 450, the glass-phosphor platelets are placed upon each light emitting element on the substrate, with the phosphor in direct contact with the light emitting surface of the light emitting element.

At 460, the glass-phosphor platelets are laminated to the light emitting elements by applying heat at 120-150° C. Optionally, the substrate with the light emitting elements may be preheated to this temperature before the glass-phosphor platelets are placed upon the light emitting elements at 450.

At 470, a reflective mold material is applied to surround each of the laminated light emitting and wavelength converting structures on the substrate, and allowed and/or further processed to harden the mold material. The particular hardening process will be dependent upon the particular mold material used.

At 480, if the mold material obscures the light emitting surface of the glass-phosphor platelet, the material is finished to expose the surface of the glass-phosphor platelet.

At 490, the substrate with light emitting and wavelength converting structures surrounded by the mold material is sliced/diced to form individual light emitting devices. As noted above, the substrate generally includes contacts that extend through the substrate, allowing external contact to the contact pads of the light emitting element. Alternatively, if the substrate is provided as a temporary support, it may be removed to expose the contact pads. This removal may occur prior to the slicing/dicing of the encased light emitting and wavelength converting structures, thereby allowing the substrate to be reused.

In the example embodiments presented above, the transparent substrate has been illustrated as a rectilinear structure with flat upper and lower surfaces. In alternative embodiments, the transparent substrate may be shaped to provide a desired light output pattern through its light emitting surface.

Figure 5A:
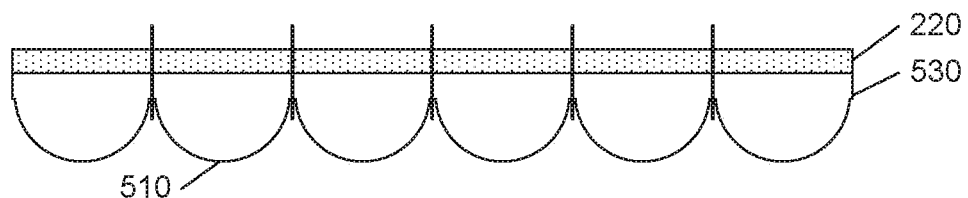
FIGS. 5A-5B illustrate example alternative shaped transparent substrates.
Figure 5B:
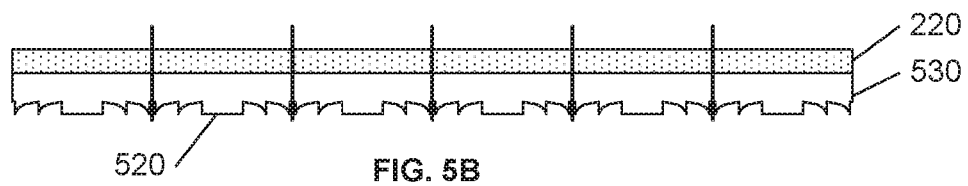

FIGS. 5A-5B illustrate example alternative shaped transparent substrates. In each of these examples, the wavelength converting film 220 is laminated to a substantially flat surface of the transparent substrate 530, opposite the surfaces 510, 520 of the substrate 530 that will eventually form the light emitting surface of the finished light emitting device (not shown).

In FIG. 5A, the light emitting surface 510 of the transparent substrate 530 includes hemispherical domes that serve to allow the light that to exit the surface 510 within a broad range of angles.

In FIG. 5B, the light emitting surface 520 of the transparent substrate 530 includes shaped contours that serve to collimate the light that exits the surface 520.

One of skill in the art will recognize that the light emitting surface of the transparent substrate 530 may be formed in any of a variety of shapes or patterns so as to provide a desired light output pattern from the device.

While the invention has been illustrated and described in detail in the drawings and foregoing description, such illustration and description are to be considered illustrative or exemplary and not restrictive; the invention is not limited to the disclosed embodiments.

For example, it is possible to operate the invention in an embodiment wherein the wavelength converting material is deposited in liquid/semi-liquid form upon the transparent substrate, rather than the release film, then spun or otherwise processed to form a coating of the desired thickness.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Reference signs in the claims, if any, should not be construed as limiting the scope of the claims.

The invention claimed is:

1. A method of producing a light emitting device, comprising:
   providing a plurality of light emitting elements on a support substrate;
   forming a wafer by laminating a wavelength conversion film to a transparent substrate that is glass or sapphire at a first temperature that semi-cures the wavelength conversion film and adheres the wavelength conversion film to the transparent substrate;
   slicing the wafer into a plurality of platelets each comprising a portion of the wavelength conversion film which has been semi-cured;
   placing each of the plurality of platelets on a respective light-emitting element of the plurality of light emitting elements, so that the portion of the wavelength conversion film of each of the plurality of platelets is in direct contact with the respective light-emitting element; and
   laminating each of the plurality of platelets to the respective light-emitting element at a second temperature that adheres the portion of the wavelength conversion film directly to the respective light-emitting element and fully cures the wavelength conversion film to form the light emitting device including a light emitting surface of the transparent substrate.

2. The method of claim 1, further comprising:
   applying a reflective mold material to completely cover each of the plurality of light emitting elements with laminated wavelength conversion layers on the support substrate; and
   finishing the reflective mold material to expose a surface of the transparent substrate.

3. The method of claim 1, wherein the first temperature is 70° C. to 100° C. for a polymer having a curing temperature of 140° C. to 160° C.

4. The method of claim 3, wherein the second temperature is 120° C. to 150° C.

5. The method of claim 3, further comprising forming the wavelength conversion film prior to laminating the wavelength conversion film to the transparent substrate.

6. The method of claim 1, further comprising
   binning each of a plurality of light emitting elements into bins having different wavelength ranges of light emitted by each of the plurality of light emitting elements;
   testing the wavelength conversion characteristic of the wavelength conversion film; and
   matching the wavelength conversion film to one of the bins of the plurality of light emitting elements based on a desired composite color output of at least some of the plurality of light emitting elements and the wavelength conversion film.

7. The method of claim 2, further comprising
   after finishing the reflective mold material, dicing the reflective mold material and the support substrate to form individual light emitting devices each comprising the respective one light emitting element.

8. The method of claim 2, wherein the finishing comprises microbead blasting.

9. The method of claim 2, wherein the finishing roughens the surface of the transparent substrate, reducing total internal reflections (TIR) at the surface.

10. The method of claim 1, wherein the wavelength conversion film includes one or more phosphors embedded in a polymer material.

11. The method of claim 10, wherein the polymer material is a silicone polymer.

12. The method of claim 1, wherein the transparent substrate includes a non-planar surface opposite a surface that is in direct contact with the wavelength conversion film.

13. The method of claim 1, further comprising disposing a reflective material to surround each of the plurality of platelets and the respective light emitting element.

14. The method of claim 13, wherein the reflective material is a mixture of silicone and $TiO_2$, with a concentration of at least 20% $TiO_2$.

15. The method of claim 1, wherein the transparent substrate is between 50 and 200 microns thick, and the wavelength conversion film is between 50 and 150 microns thick.

* * * * *